United States Patent
Buist

[11] Patent Number: 6,028,500
[45] Date of Patent: Feb. 22, 2000

[54] AUDIBLE NOISE SUPPRESSOR FOR PLANAR MAGNETIC DEVICES

[75] Inventor: Leonard W. Buist, Thornton, Colo.

[73] Assignee: Lucent Technologies Inc., Murray Hill, N.J.

[21] Appl. No.: 09/249,937

[22] Filed: Feb. 12, 1999

[51] Int. Cl.[7] .................................................. H01F 27/00
[52] U.S. Cl. ........................ 336/100; 381/124; 381/94.1; 381/71.1; 336/200; 336/232
[58] Field of Search .................................. 381/71.1, 71.7, 381/94.1, 412, 413, 124, FOR 123, FOR 124; 336/160, 196, 197, 200, 232

[56] References Cited

U.S. PATENT DOCUMENTS

| | | | |
|---|---|---|---|
| 3,173,117 | 3/1965 | Franklin | 336/100 |
| 3,668,586 | 6/1972 | Horbach | 336/196 |
| 4,318,068 | 3/1982 | Hori | 336/100 |
| 4,394,636 | 7/1983 | Hiraku et al. | 336/172 |
| 4,447,796 | 5/1984 | Heinrichs | 336/196 |
| 4,536,734 | 8/1985 | Mabuchi | 336/196 |
| 5,184,104 | 2/1993 | Kondo | 336/100 |
| 5,264,815 | 11/1993 | Umeya et al. | 336/197 |
| 5,414,402 | 5/1995 | Mandai et al. | 336/196 |
| 5,566,047 | 10/1996 | Kahn et al. | 336/100 |
| 5,777,537 | 7/1998 | Allen et al. | 336/96 |
| 5,781,093 | 7/1998 | Grandmont et al. | 336/200 |
| 5,920,249 | 7/1999 | Huss | 336/197 |

FOREIGN PATENT DOCUMENTS

| | | | |
|---|---|---|---|
| 6-104128 | 4/1994 | Japan | 336/100 |

*Primary Examiner*—Forester W. Isen
*Assistant Examiner*—Xu Mei
*Attorney, Agent, or Firm*—Duft, Graziano & Forest, P.C.

[57] ABSTRACT

The audible noise suppressor for planar magnetic devices functions to eliminate the audible noise generated by the normal operation of a planar magnetic device. This is accomplished by the use of a spacer device which functions to fill the gap between the ferrite core and the printed wiring board. The planar magnetic device comprises an E-shaped ferrite core comprising first second and middle legs, the three legs being inserted through mating holes formed in the printed wiring board. The windings of the planar magnetic device are deposited on the surface of the printed wiring board, in a predetermined pattern about the middle leg of the E-shaped ferrite core that protrudes through the corresponding hole in the printed wiring board. An I-shaped ferrite core is placed in position to span the first, second and middle legs of the E-shaped ferrite core. The E-shaped and I-shaped ferrite cores are held in place by the use of a clip that snap fits over the two ferrite cores. To eliminate the vibrations caused by the operation of the planar magnetic device, a spacer is inserted between the I-shaped ferrite core and the printed wiring board during the assembly process until it locks in place. The spacer fills the opening between the I-shaped ferrite core and the printed wiring board and is locked into place by protrusions that are located on each finger of the spacer and along the main body of the spacer. The spacer exerts a force against both the I-shaped ferrite core and the printed wiring board to provide a vibration transmission path that both partially damps the generated vibration and transmits the vibration to the printed wiring board. The entire assembly process of the planar magnetic device is independent of the use of adhesive and is a mechanically simple and efficient process.

14 Claims, 2 Drawing Sheets

AUDIBLE NOISE SUPPRESSOR FOR PLANAR MAGNETIC DEVICES

FIELD OF THE INVENTION

This invention relates to planar magnetic devices and, in particular, to an apparatus that suppresses the audible noise that is generated by the operation of a planar magnetic device when it is mounted on a printed wiring board.

PROBLEM

It is a problem in the field of planar magnetic devices that the required gap in the ferrite core results in the generation of audible noise during routine operation of the planar magnetic device. Planar magnetic devices are being used in applications such as power supplies to replace the large and costly transformers. This is accomplished by the use of a ferrite core, with built in copper windings, that is assembled directly to a printed wiring board. The ferrite core has a gap, which results in a loose fit of the ferrite core to the printed wiring board. A vibration can be generated in the ferrite core when the basic line and/or operating frequency creates a cyclic magnetic constriction of the ferrite core, resulting in an audible noise or rattle. The traditional solution to this problem is to immobilize the ferrite core and transfer the vibration to a larger mass, where the vibration is damped or absorbed. The printed wiring board is typically used for this purpose, and the vibrations transmitted from the ferrite core to the printed wiring board are further transmitted to the complete power unit in which the printed wiring board is mounted, thereby eliminating the noise by the combined absorption and damping actions of these large masses.

A problem with this solution is that the ferrite core is typically secured to the printed wiring board by the use of an adhesive, such as RTV or epoxy. This process requires the application of the adhesive to the printed wiring board and the placement of the ferrite core on the adhesively coated area. This subassembly must then be placed aside for a predetermined length of time to enable the adhesive to properly cure. This process requires the use of numerous assembly steps, is time consuming and costly and the ferrite core can be misaligned or result in a poor bond due to an inadequate application of epoxy. In an assembly line operation, the interruption of the flow of manufacture occasioned by the need to epoxy the ferrite core to the printed wiring board and the space required to temporarily store the curing subassemblies represent additional cost of manufacture due to the vibration that is generated by the operation of the ferrite core.

SOLUTION

The above-described problems are solved and a technical advance achieved in the field by the present audible noise suppressor for planar magnetic devices which functions to eliminate the audible noise generated by the normal operation of a planar magnetic device. This is accomplished by the use of a spacer device which functions to fill the gap between the ferrite core and the printed wiring board. The planar magnetic device comprises an E-shaped ferrite core comprising first second and middle legs, the three legs being inserted through mating holes formed in the printed wiring board. The windings of the planar magnetic device are deposited on the surface of the printed wiring board, in a predetermined pattern about the middle leg of the E-shaped ferrite core that protrudes through the corresponding hole in the printed wiring board. An I-shaped ferrite core is placed in position to span the first, second and middle legs of the E-shaped ferrite core. The E-shaped and I-shaped ferrite cores are held in place by the use of a clip that snap fits over the two ferrite cores. To eliminate the vibrations caused by the operation of the planar magnetic device, a spacer is inserted between the I-shaped ferrite core and the printed wiring board during the assembly process until it locks in place. The spacer fills the opening between the I-shaped ferrite core and the printed wiring board and is locked into place by protrusions that are located on each finger of the spacer and along the main body of the spacer. The spacer exerts a force against both the I-shaped ferrite core and the printed wiring board to provide a vibration transmission path that both partially damps the generated vibration and transmits the vibration to the printed wiring board. The entire assembly process of the planar magnetic device is independent of the use of adhesive and is a mechanically simple and efficient process.

DETAILED DESCRIPTION

Figure 1:
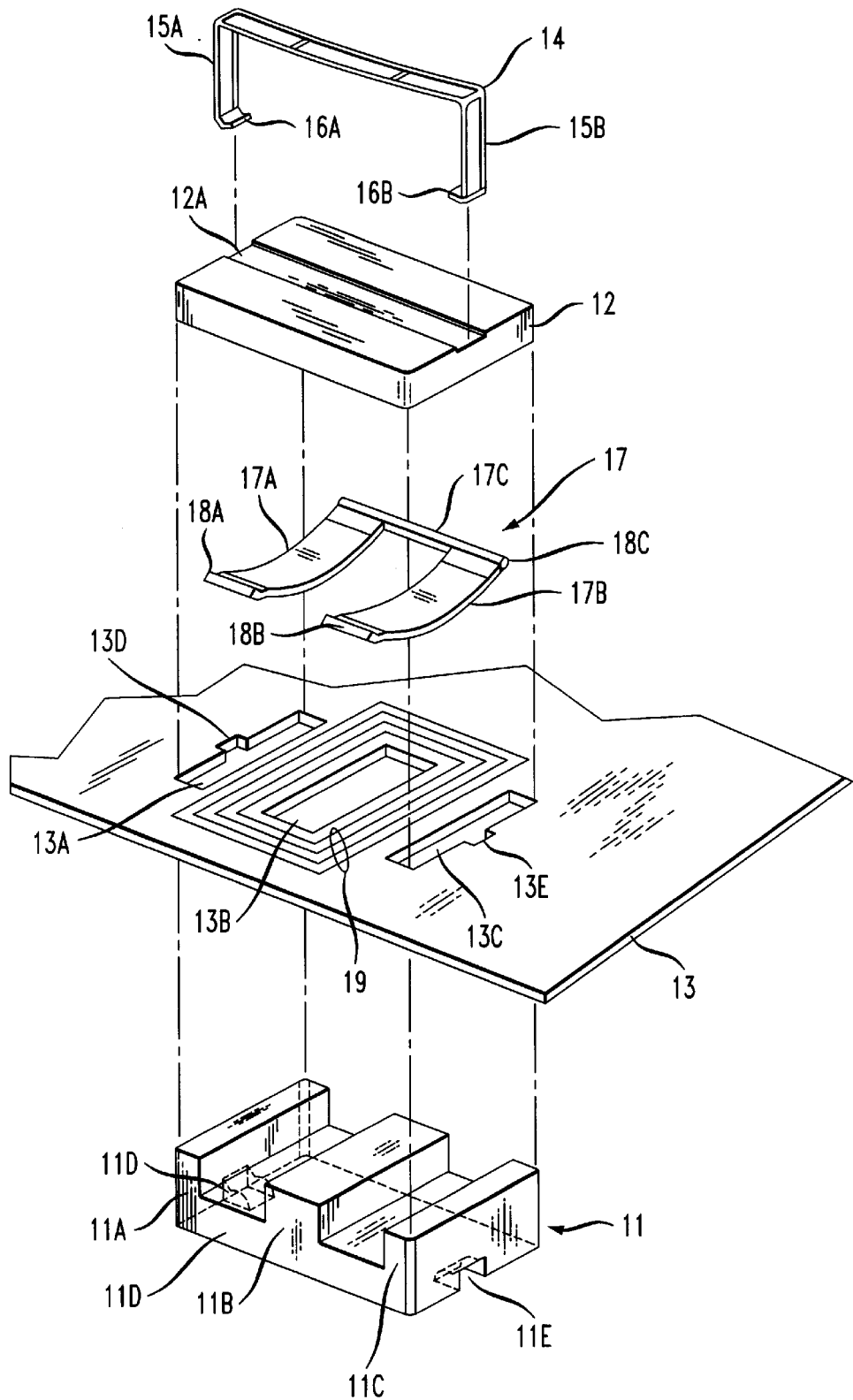
FIG. 1 illustrates a perspective exploded view of the present audible noise suppressor for planar magnetic devices.
Figure 2:
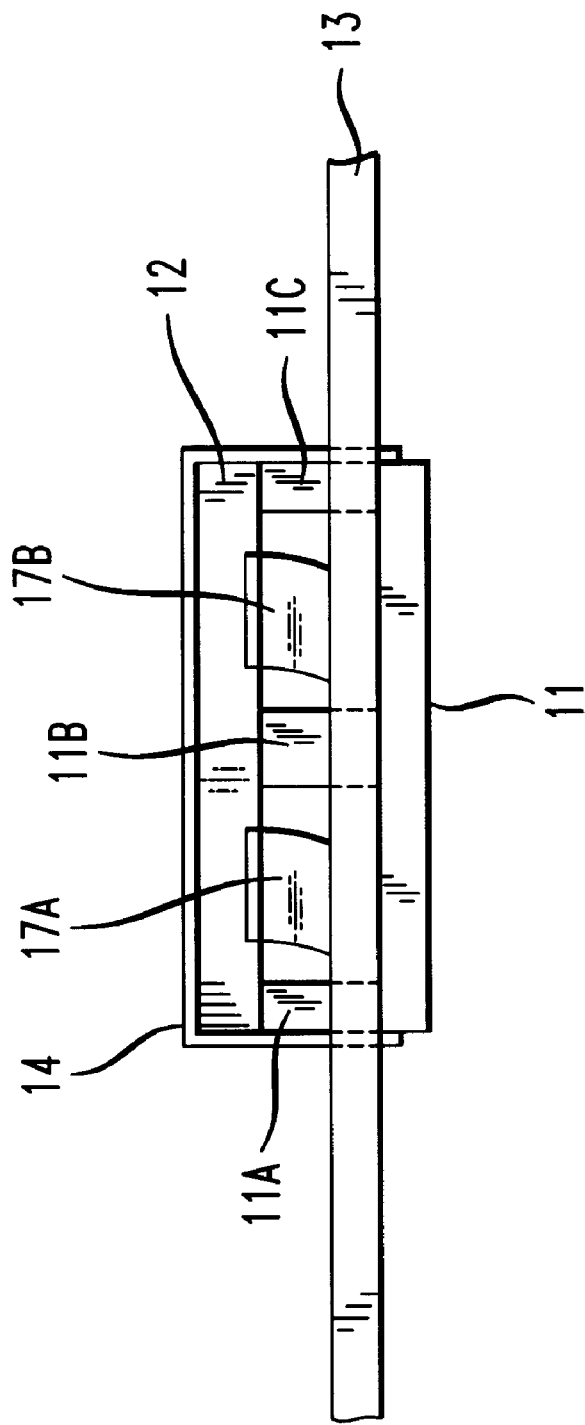
FIG. 2 illustrates a side plan view of the assembled present audible noise suppressor for planar magnetic devices.

FIGS. 1 and 2 illustrate a perspective exploded view and a side plan view of the present audible noise suppressor for planar magnetic devices. The planar magnetic device 1 is comprised of two conventional ferrite cores 11, 12. The first ferrite core 11 is an E-shaped element of conventional manufacture, having three arms 11A–11C that extend from the body 11D of the first ferrite core 11. The first ferrite core 11 is positioned in a manner as is shown in FIGS. 1 and 2 so that the first ferrite core 11 is in contact with the printed wiring board 13 and the arms 11A–11C of the first ferrite core 11 extend through the corresponding holes 13A–13C formed in the printed wiring board 13. The windings of the planar magnetic device comprise conductors 19 that are deposited on the surface of the printed wiring board 13 in a predetermined pattern around the center hole 13B (and the leg 11B of ferrite core 11 protruding through center hole 13B). The planar magnetic device also includes a second ferrite core element 12 which as illustrated in FIGS. 1 and 2 comprises an I-shaped ferrite core 12. This second ferrite core 12 can also be E-shaped, but the I-shaped ferrite core element is illustrated herein for the purpose of teaching the concepts of this invention.

The ferrite cores 11 and 12 are physically held together and in contact with the printed wiring board 13 by the use of a clip 14 that is manufactured of a robust, flexible material, such as flexible plastic member. The clip 14 fits into feature 12A formed in the top surface of the second ferrite core 12 to prevent sideways movement of the clip 14 on second ferrite core 12. The clip 14 includes two downwardly extending arms 15A, 15B, each of which includes a locking feature 16A, 16B formed at the distal end thereof to snap fit over the two ferrite cores 11, 12 to hold the two ferrite cores 11, 12 together in place on the printed wiring board 13. The holes 13A, 13C include slots 13D, 13E formed therein to accept the two arms 15A, 15B of clip 14 when clip 14 is placed over the second ferrite core 12 and the first ferrite core 11. The locking features 16A, 16B of clip 14 mate with apertures 11D, 11E formed in the first ferrite core 11 to secure the second ferrite core 12 in contact with the three upwardly extending arms 11A–11C of E-shaped first ferrite core 11.

The application of a driving electrical voltage at a selected frequency to the windings 19 of the planar magnetic device induces a harmonic force in the two ferrite cores 11, 12, which harmonic force causes the two ferrite cores 11, 12 to vibrate. The vibration is both damped and transmitted to the printed wiring board 13 by means of spacer 17. The spacer 17 is manufactured of a robust, flexible material, such as flexible plastic member and is U-shaped, comprising two curved arms 17A, 17B, which are connected together at one end thereof by body 17C. The arms 17A, 17B as well as body 17C include locking features 18A, 18B, 18C that serve to prevent movement of spacer 17 once spacer 17 is located in place between the second ferrite core 12 and printed wiring board 13. The locking features 18A–18C prevent lateral movement of spacer 17 since the locking features 18A–18C engage the edges of the second ferrite core 12. The vibrations generated in the two ferrite cores 11, 12 are mechanically transmitted to the printed wiring board 13 through spacer 17.

Summary

The audible noise suppressor for planar magnetic devices eliminates the audible noise generated by the normal operation of a planar magnetic device. This is accomplished by the use of a spacer device which functions to fill the gap between the ferrite core and the printed wiring board. The spacer exerts a force against both the I-shaped ferrite core and the printed wiring board to provide a vibration transmission path that both partially damps the generated vibration and transmits the vibration to the printed wiring board. The entire assembly process of the planar magnetic device is independent of the use of adhesive and is a mechanically simple and efficient process.

What is claimed:

1. A audible noise suppressor for suppressing vibrations generated in planar magnetic devices in response to a driving electrical signal, comprising:

a first ferrite core having an E-shaped structure comprising first and second legs, each located at a distal end of a body of said first ferrite core, and a middle leg disposed substantially midway between said first and second legs, said first, second and middle legs being arranged in a parallel-spaced apart relationship to form the E-shape;

a printed wiring board having first, second and middle holes for receiving said first, second and middle legs of said E-shaped ferrite core;

a second ferrite core spanning ends of said first, second and middle legs of said E-shaped first ferrite core that protrude through said printed wiring board;

a clip means for securing said first ferrite core and said second ferrite core together; and spacer means insertable between said second ferrite core and said printed wiring board for transmitting vibrations generated in said planar magnetic device to said printed wiring board.

2. The audible noise suppressor of claim 1 wherein said second ferrite core comprises:

an I-shaped ferrite core spanning said first, second and middle legs of said E-shaped first ferrite core that protrude through said printed wiring board.

3. The audible noise suppressor of claim 1 wherein said spacer means comprises:

a spring loaded clip having a U-shaped structure comprising first and second legs, each located at a distal end of a body of said spring loaded clip, each of said first and second legs of said spring loaded clip being insertable between a respective one of a space between said first and said middle legs of said first ferrite core and a space between said second and said middle legs of said first ferrite core, respectively; and a body connecting respective ends of said first and said second legs of said spring loaded clip.

4. The audible noise suppressor of claim 3 wherein said spacer means further comprises:

locking features formed on an end of both of said first and said second legs of said spring loaded clip located distal from said body of said spring loaded clip and on said body of said spring loaded clip, said locking features engagable with an edge of said second ferrite core.

5. The audible noise suppressor of claim 3 wherein said first and said second legs of said spacer means further comprises:

a substantially flat curved surface that is deformable to fit between said printed wiring board and said second ferrite core.

6. The audible noise suppressor of claim 1 wherein said clip means comprises:

a spring loaded clip having a U-shaped structure comprising first and second legs, each located at a distal end of a body of said spring loaded clip, each of said first and second legs of said spring loaded clip being positionable to encircle said first ferrite core and said second ferrite core to hold said first ferrite core and second ferrite core together.

7. The audible noise suppressor of claim 6 wherein said clip means further comprises:

locking features formed on an end of both of said first and said second legs of said spring loaded clip located distal from said body of said spring loaded clip and on said body of said spring loaded clip, said locking features engagable with corresponding locking features of said first ferrite core.

8. The audible noise suppressor of claim 6 wherein said second ferrite core comprises:

a locking feature formed on a top surface of said second ferrite core for preventing movement of said body of said spring loaded clip.

9. An audible noise suppressor for suppressing vibrations generated in planar magnetic devices in response to a driving electrical signal, comprising:

a first ferrite core having an E-shaped structure comprising first and second legs, each located at a distal end of a body of said first ferrite core, and a middle leg disposed substantially midway between said first and second legs, said first, second and middle legs being arranged in a parallel-spaced apart relationship to form the E-shape;

a printed wiring board having first, second and middle holes for receiving said first, second and middle legs of said E-shaped ferrite core;

a second ferrite core having an I-shaped structure spanning ends of said first, second and middle legs of said E-shaped first ferrite core that protrude through said printed wiring board;

a clip means for securing said first ferrite core and said second ferrite core together; and spacer means insertable between said second ferrite core and said printed wiring board for transmitting vibrations generated in said planar magnetic device to said printed wiring board, comprising:

a spring loaded clip having a U-shaped structure comprising first and second legs, each located at a distal end of a body of said spring loaded clip, each of said first and second legs of said spring loaded clip being insertable between a respective one of a space between said first and said middle legs of said first ferrite core and a space between said second and said middle legs of said first ferrite core, respectively; and a body connecting respective ends of said first and said second legs of said spring loaded clip.

10. The audible noise suppressor of claim 9 wherein said spacer means further comprises:

locking features formed on an end of both of said first and said second legs of said spring loaded clip located distal from said body of said spring loaded clip and on said body of said spring loaded clip, said locking features engagable with an edge of said second ferrite core.

11. The audible noise suppressor of claim 9 wherein said first and said second legs of said spacer means further comprises:

a substantially flat curved surface that is deformable to fit between said printed wiring board and said second ferrite core.

12. The audible noise suppressor of claim 9 wherein said clip means comprises:

a spring loaded clip having a U-shaped structure comprising first and second legs, each located at a distal end of a body of said spring loaded clip, each of said first and second legs of said spring loaded clip being positionable to encircle said first ferrite core and said second ferrite core to hold said first ferrite core and second ferrite core together.

13. The audible noise suppressor of claim 12 wherein said clip means further comprises:

locking features formed on an end of both of said first and said second legs of said spring loaded clip located distal from said body of said spring loaded clip and on said body of said spring loaded clip, said locking features engagable with corresponding locking features of said first ferrite core.

14. The audible noise suppressor of claim 12 wherein said second ferrite core comprises:

a locking feature formed on a top surface of said second ferrite core for preventing movement of said body of said spring loaded clip.

* * * * *